(12) United States Patent
Ogino

(10) Patent No.: US 10,937,455 B2
(45) Date of Patent: Mar. 2, 2021

(54) FE—PT BASED MAGNETIC MATERIAL SINTERED COMPACT

(71) Applicant: JX Nippon Mining & Metals Corporation, Tokyo (JP)

(72) Inventor: Shin-ichi Ogino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 16/933,071

(22) Filed: Jul. 20, 2020

(65) Prior Publication Data

US 2020/0357433 A1 Nov. 12, 2020

Related U.S. Application Data (62) Division of application No. 14/414,518, filed as application No. PCT/JP2013/071249 on Aug. 6, 2013, now Pat. No. 10,755,737.

(30) Foreign Application Priority Data

Sep. 21, 2012 (JP) ................. 2012-208527

(51) Int. Cl.
*G11B 5/65* (2006.01)
*C23C 14/34* (2006.01)
(Continued)

(52) U.S. Cl.
CPC .............. *G11B 5/653* (2013.01); *C22C 5/04* (2013.01); *C22C 32/0005* (2013.01); *C22C 33/02* (2013.01); *C22C 33/0278* (2013.01); *C22C 33/0292* (2013.01); *C22C 38/002* (2013.01); *C22C 38/16* (2013.01); *C23C 14/3414* (2013.01); *C30B 29/16* (2013.01); *C30B 29/38* (2013.01); *G11B 5/65* (2013.01);
(Continued)

(58) Field of Classification Search
CPC ....... B22F 3/15; C22C 1/1084; C22C 1/0466; C22C 1/051; C22C 32/0005; C22C 33/02; C22C 33/0278; C22C 33/0292; C22C 38/002; C22C 38/16; C22C 5/04; C30B 29/16; C30B 29/38; G11B 5/65; G11B 5/653; H01F 1/33; H01F 41/183
USPC .......................................................... 75/233
See application file for complete search history.

(56) References Cited

U.S. PATENT DOCUMENTS 8,124,211 B2 2/2012 Sasa et al.
2002/0076557 A1* 6/2002 Fauzi ................ C01B 21/064
428/402
(Continued)

FOREIGN PATENT DOCUMENTS

JP S63-259068 A 10/1988
JP H03-288321 A 12/1991
(Continued)

Primary Examiner — Nicholas A Wang
(74) Attorney, Agent, or Firm — Howson & Howson LLP (57) ABSTRACT

Provided is an Fe—Pt based magnetic material sintered compact, comprising BN and $SiO_2$ as non-magnetic materials, wherein Si and O are present in a region where B or N is present at a cut surface of the sintered compact. A high density sputtering target is provided which enables production of a magnetic thin film for heat-assisted magnetic recording media, and also reduces the amount of particles generated during sputtering.

18 Claims, 6 Drawing Sheets

(51) Int. Cl.
*G11B 5/851* (2006.01)
*C22C 32/00* (2006.01)
*C22C 33/02* (2006.01)
*H01F 41/18* (2006.01)
*C22C 5/04* (2006.01)
*C22C 38/00* (2006.01)
*C22C 38/16* (2006.01)
*C30B 29/16* (2006.01)
*C30B 29/38* (2006.01)
*H01F 1/33* (2006.01)
*H01F 10/12* (2006.01)
*C22C 1/05* (2006.01)
*C22C 1/04* (2006.01)

(52) U.S. Cl.
CPC .............. *G11B 5/851* (2013.01); *H01F 1/33* (2013.01); *H01F 41/183* (2013.01); *B22F 2998/10* (2013.01); *B22F 2999/00* (2013.01); *C22C 1/0466* (2013.01); *C22C 1/051* (2013.01); *H01F 10/123* (2013.01)

(56) References Cited

U.S. PATENT DOCUMENTS

| | | |
|---|---|---|
| 2002/0160232 A1 | 10/2002 | Shimizu et al. |
| 2006/0222897 A1 | 10/2006 | Kamata et al. |
| 2007/0020487 A1 | 1/2007 | Lim et al. |
| 2007/0189916 A1* | 8/2007 | Zhang ............... C22C 27/06 419/66 |
| 2009/0242393 A1 | 10/2009 | Satoh |
| 2011/0212346 A1 | 9/2011 | Onoue et al. |
| 2012/0241316 A1 | 9/2012 | Arakawa |
| 2013/0098760 A1 | 4/2013 | Takami et al. |
| 2013/0168240 A1 | 7/2013 | Ogino et al. |
| 2013/0292245 A1 | 7/2013 | Ikeda et al. |
| 2013/0206591 A1 | 8/2013 | Takami et al. |
| 2013/0213803 A1 | 8/2013 | Sato et al. |
| 2013/0248362 A1 | 9/2013 | Ogino et al. |
| 2013/0306470 A1 | 11/2013 | Ogino et al. |
| 2013/0306471 A1 | 11/2013 | Ishiyama et al. |
| 2014/0083847 A1 | 3/2014 | Sato |
| 2014/0231250 A1 | 8/2014 | Ogino et al. |
| 2015/0060268 A1 | 3/2015 | Ogino |
| 2015/0107991 A1 | 4/2015 | Sato |

FOREIGN PATENT DOCUMENTS

| | | |
|---|---|---|
| JP | H06-049510 A | 2/1994 |
| JP | 2003-313659 A | 11/2003 |
| JP | 2003313659 * | 11/2003 |
| JP | 2010-159491 A | 7/2010 |
| JP | 2011-208167 A | 10/2011 |
| JP | 2011-210291 A | 10/2011 |
| JP | 2012-102387 A | 5/2012 |

* cited by examiner

FE—PT BASED MAGNETIC MATERIAL SINTERED COMPACT

CROSS REFERENCE TO RELATED APPLICATIONS

This application is a divisional of co-pending U.S. application Ser. No. 14/414,518 which is a 371 National Stage of International Application No. PCT/JP2013/071249, filed Aug. 6, 2013, which claims the benefit under 35 USC 119 of Japanese Application No. 2012-208527, filed Sep. 21, 2012.

BACKGROUND

The present invention relates to a sintered compact used in manufacture of a magnetic thin film for heat-assisted magnetic recording media, and a manufacturing method thereof.

In the field of magnetic recording represented by hard disk drives, a material based on a ferromagnetic metal Co, Fe or Ni is used as a material for a magnetic thin film in a magnetic recording medium. For example, Co—Cr based or Co—Cr—Pt based ferromagnetic alloys having Co as a main component are used for magnetic thin films in hard disks employing the longitudinal magnetic recording system. Further, a composite material composed of a Co—Cr—Pt based ferromagnetic alloy having Co as a main component, and non-magnetic inorganic grains is often used for a magnetic thin film in a hard disk employing the recently-commercialized perpendicular magnetic recording system. In many cases, the above magnetic thin films are manufactured by sputtering a target consisting primarily of the above materials using a DC magnetron sputtering equipment in view of high productivity.

The recording density of a hard disk is rapidly increasing every year, and a current surface density of 600 Gbit/in$^2$ may reach 1 Tbit/in$^2$ in the future. If the recording density reaches 1 Tbit/in$^2$, then the size of a recording bit becomes smaller than 10 nm. In that case, a problem of superparamagnetization due to thermal fluctuation may arise. Further, it is predicted that materials for magnetic recording media currently used, for example, materials in which magnetocrystalline anisotropy is enhanced by adding Pt to a Co—Cr based alloy, will be insufficient. This is because magnetic grains with a size of 10 nm or less stably showing ferromagnetic behavior are required to have higher magnetocrystalline anisotropy.

In view of the above reason, a FePt phase having the L1$_0$ structure has gathered much attention as a material for ultrahigh density recording media. A FePt phase is a promising material suitable for applications of magnetic recording media since it has high magnetic crystalline anisotropy as well as excellent corrosion resistance and oxidation resistance. Meanwhile, in order to use a FePt phase as a material for ultrahigh density recording media, a technology needs to be developed which allows regularly-arranged FePt grains to be dispersed as densely as possible in an aligned orientation and in a magnetically isolated manner.

For these reasons, a granular structure magnetic thin film, in which FePt magnetic grains having the L1$_0$ structure are isolated through the interposition of nonmagnetic materials such as an oxide and carbon, has been proposed for a magnetic recording medium of a next generation hard disk adapted for the heat-assisted magnetic recording system. The granular structure magnetic thin film has a structure in which magnetic grains are magnetically insulated from each other through the interposition of nonmagnetic substances.

In general, deposition of a granular structure magnetic thin film having a Fe—Pt phase is performed using a Fe—Pt based sintered compact sputtering target.

With regard to a sputtering target of Fe—Pt based magnetic material sintered compact, the present inventors previously have disclosed a technology for a ferromagnetic sputtering target, which is configured from a magnetic phase such as an Fe—Pt alloy, and a nonmagnetic phase that decouples the magnetic phase, and in which a metal oxide is used as one of the nonmagnetic phase materials (WO2012/029498).

In addition, Japanese Patent Application Laid-Open No. 2012-102387 discloses a sputtering target for depositing a thin-film magnetic recording medium formed from a sintered compact having a structure in which C phases are dispersed in a FePt alloy phase. Japanese Patent Application Laid-Open No. 2011-208167 discloses a sputtering target for depositing a thin-film magnetic recording medium comprising a SiO$_2$ phase, a FePt alloy phase and an interdiffusion phase. Further, WO2012/086578 discloses a Fe—Pt based ferromagnetic material sputtering target comprising Pt, SiO$_2$, Sn, and the remainder being Fe. Japanese Patent No. 5009447 discloses a sputtering target for depositing a magnetic recording film, in which a peak intensity ratio of the (011) plane of quartz is 1.40 or more relative to a background intensity in X-ray diffraction.

Hexagonal BN (a compound of boron and nitrogen) as the above nonmagnetic material shows excellent performance as a lubricant. The compound, however, is difficult to be used for the production of a high density sintered compact because sinterability is poor when used as a raw material for powder metallurgy. In a case where the density of a sintered compact is low as described above, defects such as cracks and chipping may occur when processing the sintered compact into a target, causing a problem of a reduced yield. Further, low density may result in a large number of voids created in a target. These voids may cause abnormal electric discharge, which, in turn, may generate particles (dust which will adhere on a substrate) during sputtering, causing a problem of a reduced product yield.

SUMMARY

An object of the present invention is to provide a Fe—Pt based sintered compact, which comprises hexagonal BN as a non-magnetic material and enables production of a magnetic thin film for heat-assisted magnetic recording media. Further, another object is to provide a high density sputtering target in which the amount of particles generated during sputtering is reduced.

After extensive studies to achieve the above objects, the present inventors have found that a high density sputtering target can be manufactured by dispersing hexagonal BN grains as a non-magnetic material, together with SiO$_2$ grains, in a Fe—Pt based parent metal. The present inventors also have found that a sputtering target manufactured in this way can significantly reduce particle generation, and can improve a deposition yield.

Based on the above findings, the present invention provides a Fe—Pt based magnetic material sintered compact, comprising hexagonal BN and SiO$_2$ as non-magnetic materials, wherein Si and O are present in a region where B or N is present at a cut surface of the sintered compact.

An X-ray diffraction peak from a (002) plane of hexagonal BN may appear in X-ray diffraction of the sintered compact, and an X-ray diffraction peak intensity ratio of a (101) plane of cristobalite, which is crystallized SiO$_2$, may be 1.40 or less relative to a background intensity. The X-ray diffraction peak ratio of the (002) plane of hexagonal BN relative to the background intensity may be 1.50 or more.

The content of $SiO_2$ relative to hexagonal BN may be 1 mol % or more.

The Fe—Pt based magnetic material sintered compact may comprise 5 mol % or more and 60 mol % or less of Pt, 1 mol % or more and 50 mol % or less of BN, 0.5 mol % or more and 20 mol % or less of $SiO_2$, and the remainder being Fe. The Fe—Pt based magnetic material sintered compact may include 0.5 mol % or more and 40 mol % or less of C. The Fe—Pt based magnetic material sintered compact may include 0.5 mol % or more and 10.0 mol % or less of one or more elements selected from the group consisting of B, Ru, Ag, Au and Cu as an additive element. The Fe—Pt based magnetic material sintered compact may include one or more inorganic materials selected from the group consisting of oxides, nitrides, carbides, and carbon nitrides as an additive.

Advantageously, the Fe—Pt based sintered compact according to the present invention in which BN is used as a non-magnetic material enables deposition of a magnetic thin film having a granular structure, and further can provide a high density sputtering target in which the amount of particles generated during sputtering is reduced.

DETAILED DESCRIPTION

The Fe—Pt based magnetic material sintered compact according to the present invention contains BN and $SiO_2$ as non-magnetic materials, and is characterized by the presence of Si and O in a region where B or N is present at a cut surface of the sintered compact.

Although hexagonal BN shows excellent performance as a lubricant as described above, the density of a BN-containing sintered compact is difficult to be increased because of poor sinterability. However, the sinterability can be significantly improved in a case where BN and $SiO_2$ are contained and mutually dispersed as compared with a case where BN is contained alone. A detailed mechanism why such a phenomenon occurs is not clearly understood. Nonetheless, this appears to be resulted from a high compatibility of $SiO_2$ and B as widely known that a softening temperature of $SiO_2$ glass is lowered when boric acid (B) is added to the $SiO_2$ glass.

Whether Si and O are present in a region where B or N is present at a cut surface of a sintered compact can be confirmed by element mapping created with a FE-EPMA (Field Emission Electron Probe Micro Analyzer). Specifically, complete or partial overlap between a region where B and N are present and a region where Si and O are present in element mapping can be indicative of the presence of these elements in the same region. Further, the presence of Si and O observed in a region where B and N are present suggests that BN and $SiO_2$ are solid dissolved.

In X-ray diffraction of a cut surface relative to a pressurized surface of the Fe—Pt based magnetic material sintered compact according to the present invention, an X-ray diffraction peak of the (002) plane of hexagonal BN appears, and an X-ray diffraction peak intensity ratio of the (101) plane of cristobalite, which is crystallized $SiO_2$, is preferably 1.40 or less relative to a background intensity. That is, in a case where a sintered compact is processed into a sputtering target, the generation of microcracks in the target can be controlled by allowing an X-ray diffraction peak intensity ratio of the (101) plane of cristobalite, which is $SiO_2$, to be 1.40 or more in X-ray diffraction at a cut surface parallel to a sputtering surface of the target.

An X-ray diffraction peak of the (101) plane of cristobalite, which is crystallized $SiO_2$, is observed at 21.98°. Further, a method of calculating the background intensity is as follows: ((the average value of X-ray diffraction intensities observed between 20.5° and)21.5°)+(the average value of X-ray diffraction intensities observed between 22.5° and))23.5°)/2.

In X-ray diffraction at a cut surface relative to a pressurized surface of the Fe—Pt based magnetic material sintered compact according to the present invention, an X-ray diffraction peak intensity ratio of the (002) plane of hexagonal BN is preferably 1.50 or more relative to a background intensity. That is, in a case where a sintered compact is processed into a sputtering target, the generation of microcracks in the target can be controlled by allowing an X-ray diffraction peak intensity ratio of the (002) plane of hexagonal BN to be 1.50 or more in X-ray diffraction at a cut surface parallel to a sputtering surface of the target.

An X-ray diffraction peak of the (002) plane of hexagonal BN is observed at 26.75°. Further, a method of calculating the background intensity is as follows: ((the average value of X-ray diffraction intensities observed between 25.5° and 26.5°)+(the average value of X-ray diffraction intensities observed between 27.5° and))28.5°))/2.

In the Fe—Pt based magnetic material sintered compact according to the present invention, the content of $SiO_2$ relative to the content of hexagonal BN is preferably 1% or more. Sinterability can be further improved by allowing the content of $SiO_2$ relative to hexagonal BN to be 1% or more.

In the Fe—Pt based magnetic material sintered compact according to the present invention, the content of Pt is preferably 5 mol % or more and 60 mol % or less. Good magnetic properties can be obtained by allowing the content to be 5 mol % or more and 60 mol % or less. Further, the content of BN is preferably 1 mol % or more and 50 mol % or less, and the content of $SiO_2$ is preferably 0.5 mol % or more and 20 mol % or less. The contents of these non-magnetic materials within the above numerical ranges can improve magnetic insulation. Further, dispersed C grains in an alloy are effective. The C content of 0.5 mol % or more and 40 mol % or less can improve magnetic insulation.

The Fe—Pt based magnetic material sintered compact according to the present invention may contain one or more elements selected from the group consisting of B, Ru, Ag, Au and Cu as an additive element in a total amount of 0.5 mol % or more and 10.0 mol % or less. Moreover, one or more inorganic materials selected from the group consisting of oxides, nitrides, carbides, and carbon nitrides may be added as an additive into the Fe—Pt based magnetic material sintered compact according to the present invention if desired. These additive elements and additive materials are effective components in order to improve magnetic properties of a film after sputtering.

The Fe—Pt based magnetic material sintered compact according to the present invention may be manufactured, for example, by the following method.

Each of raw material powders (a Fe powder, a Pt powder, a BN powder and a $SiO_2$ powder) is prepared for production. Further, each of raw material powders of the above additive ingredients is prepared if desired. Note that quartz or an amorphous material is preferably used for the $SiO_2$ powder. Use of cristobalite as a $SiO_2$ powder is not preferred because α-β transition occurs at 250° C., causing change in volume. As a result of this, $SiO_2$ itself may have microcracks, which may cause abnormal electric discharge.

For these powders, those with a grain diameter of 0.5 μm or more and 10 μm or less are preferably used. Since oxidation is promoted to cause the increased concentration of oxygen in a sputtering target when the grain diameter of each raw material powder is too small, the grain diameter of 0.5 μm or more is preferred. On the other hand, since fine dispersion of each component in an alloy becomes difficult when the grain diameter of each raw material powder is too large, the grain diameter of 10 μm or less is further preferred.

Further, an alloy powder (a Fe—Pt powder and the like) may be used as a raw material powder. In particular, an alloy powder containing Pt is effective because the amount of oxygen in a raw material powder can be decreased, depending on its composition. Also, in a case where an alloy powder is used, the powder having a grain diameter of 0.5 μm or more and 10 μm or less is preferably used.

Next, the above powders are weighed out to give a desired composition, and then ground and mixed by a known method. At this time, in order to interdiffuse a BN powder and a $SiO_2$ powder, both powders are preferably mixed in a state of fine powders. More effective mixing can be achieved by mixing the both while grinding. For mixing and grinding, use of a ball mill, a medium agitation mill and the like are particularly effective.

A mixed powder obtained in this way is molded and sintered by hot press. In addition to hot press, the plasma discharge sintering method and the hot isostatic sintering method may be used. In many cases, a holding temperature for sintering is within a range between 800° C. and 1400° C., depending on the composition of a sputtering target.

Then, a sintered compact removed from the hot press is subjected to hot isostatic pressing process. Hot isostatic pressing process is effective for improving the density of a sintered compact. In many cases, a holding temperature for hot isostatic pressing process is within a range between 800° C. and 1200° C., depending on the composition of a sintered compact. Further, pressing force is set at 100 MPa or more.

A sputtering target can be manufactured by processing a sintered compact obtained in this way with a lathe into a desired shape.

As described above, a Fe—Pt based magnetic material sintered compact and sputtering target containing BN and $SiO_2$ as non-magnetic materials in which Si and O are present in a region where B or N is present at a cut surface of the sintered compact can be manufactured.

EXAMPLES

In the followings, the present invention will be described with reference to Examples and Comparative Examples. Note that Examples are presented for merely illustrative purposes, and the present invention shall in no way be limited by them. That is, the present invention is limited only by the claims, and shall encompass various modifications other than those in Examples of the present invention.

Example 1

As raw material powders, a Fe powder, a Pt powder, an Ag powder, a $SiO_2$ powder and a BN powder were prepared. These powders were weighed out to give 65(50Fe-45Pt-5Ag)-5$SiO_2$-30BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were as follows: vacuum atmosphere, a rate of temperature increase of 300° C./hour, a holding temperature of 950° C. and a holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for the hot isostatic pressing process were as follows: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 97.9%.

Figure 1:
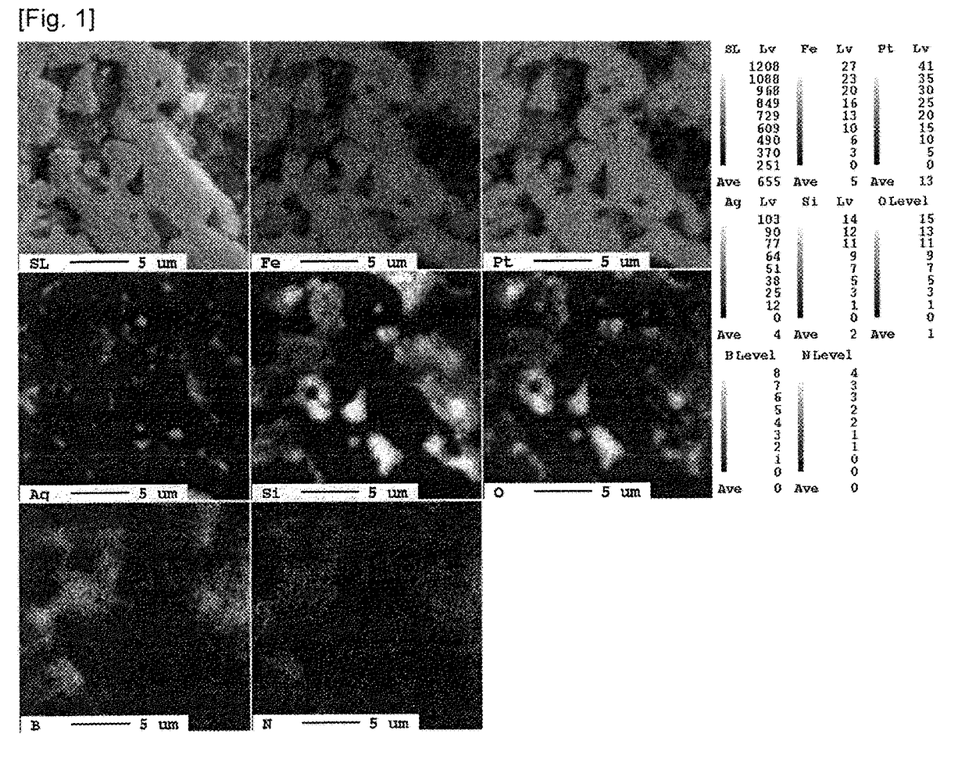
FIG. 1 shows element mapping obtained with FE-EPMA of a sintered compact from Example 1.
Figure 2:
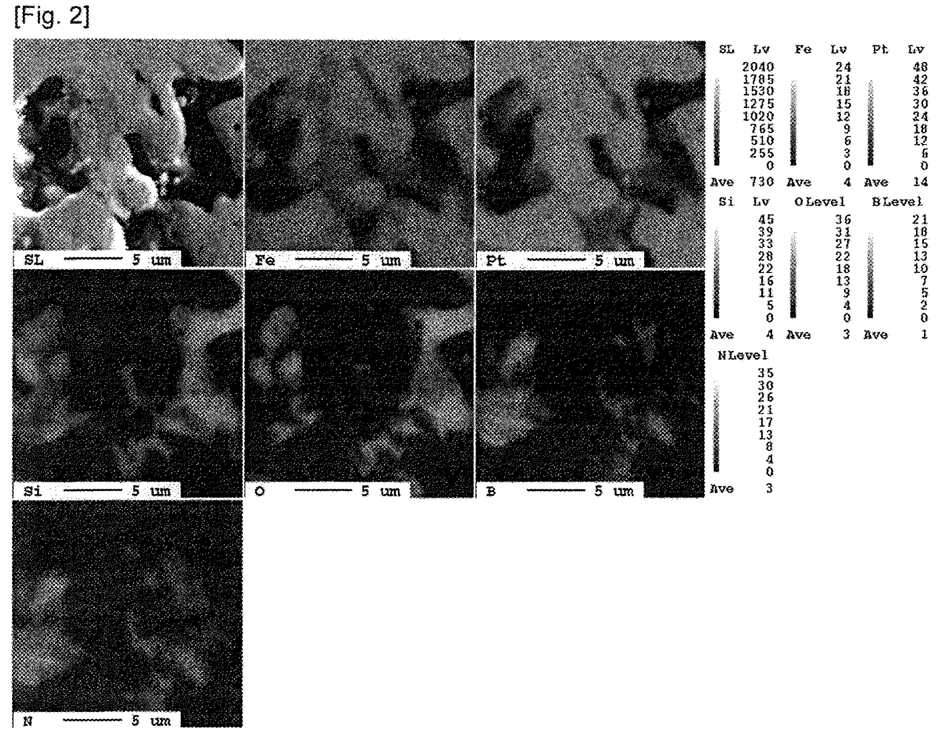
FIG. 2 shows element mapping obtained with FE-EPMA of a sintered compact from Example 2.
Figure 3:
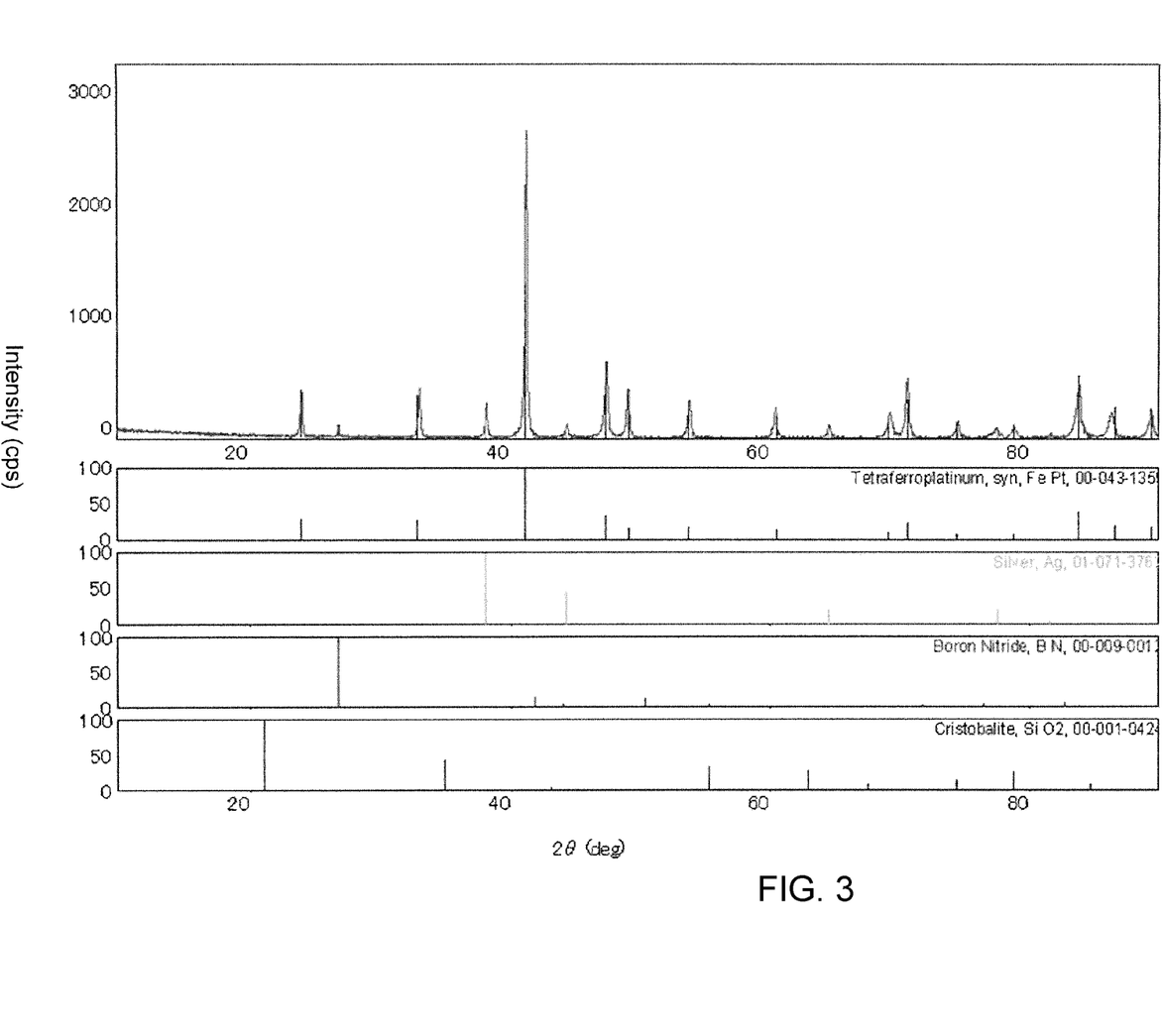
FIG. 3 shows an X-ray diffraction profile of the sintered compact from Example 1 (top panel).
Figure 4:
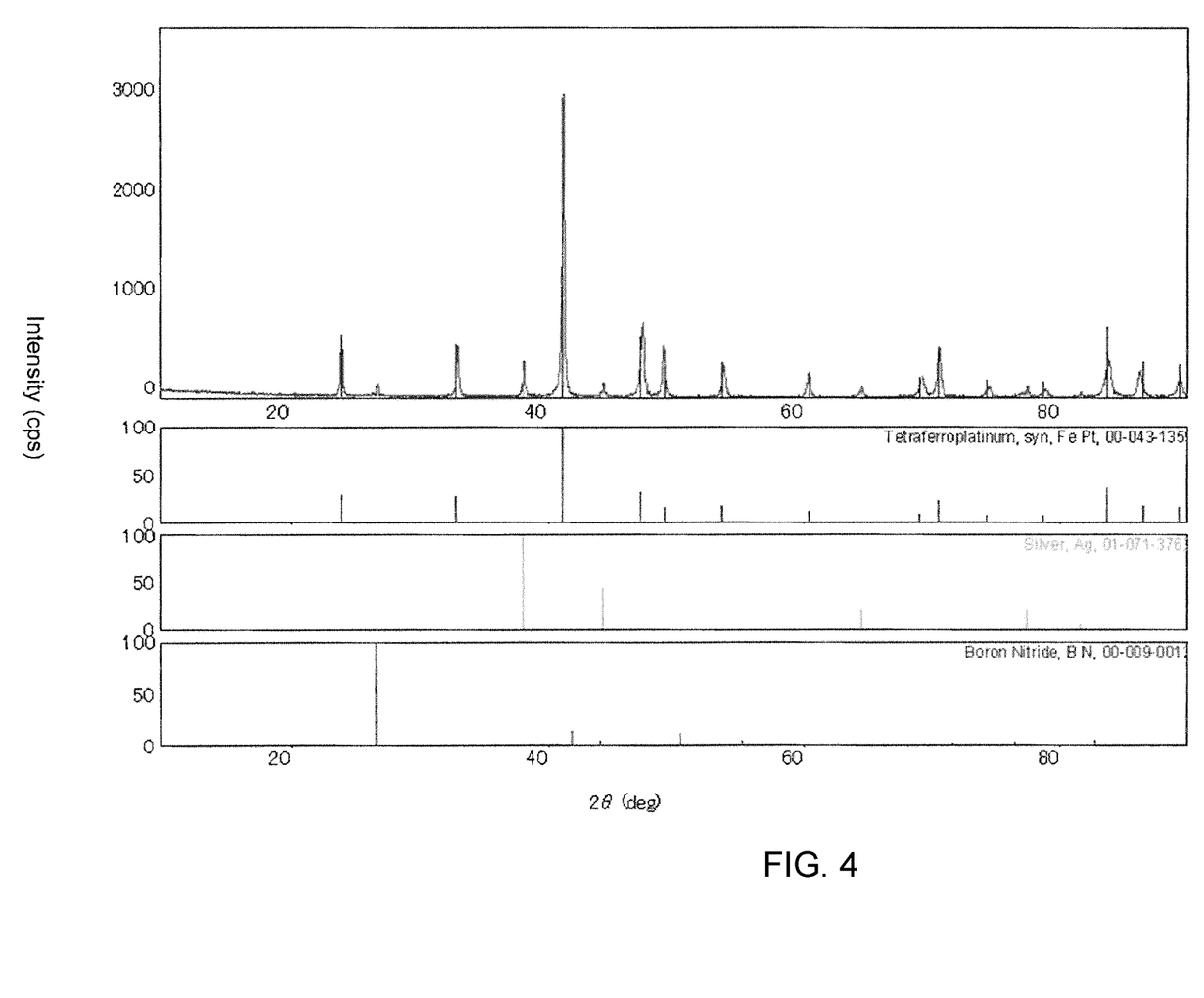
FIG. 4 shows an X-ray diffraction profile of a sintered compact from Comparative Example 1 (top panel).
Figure 5:
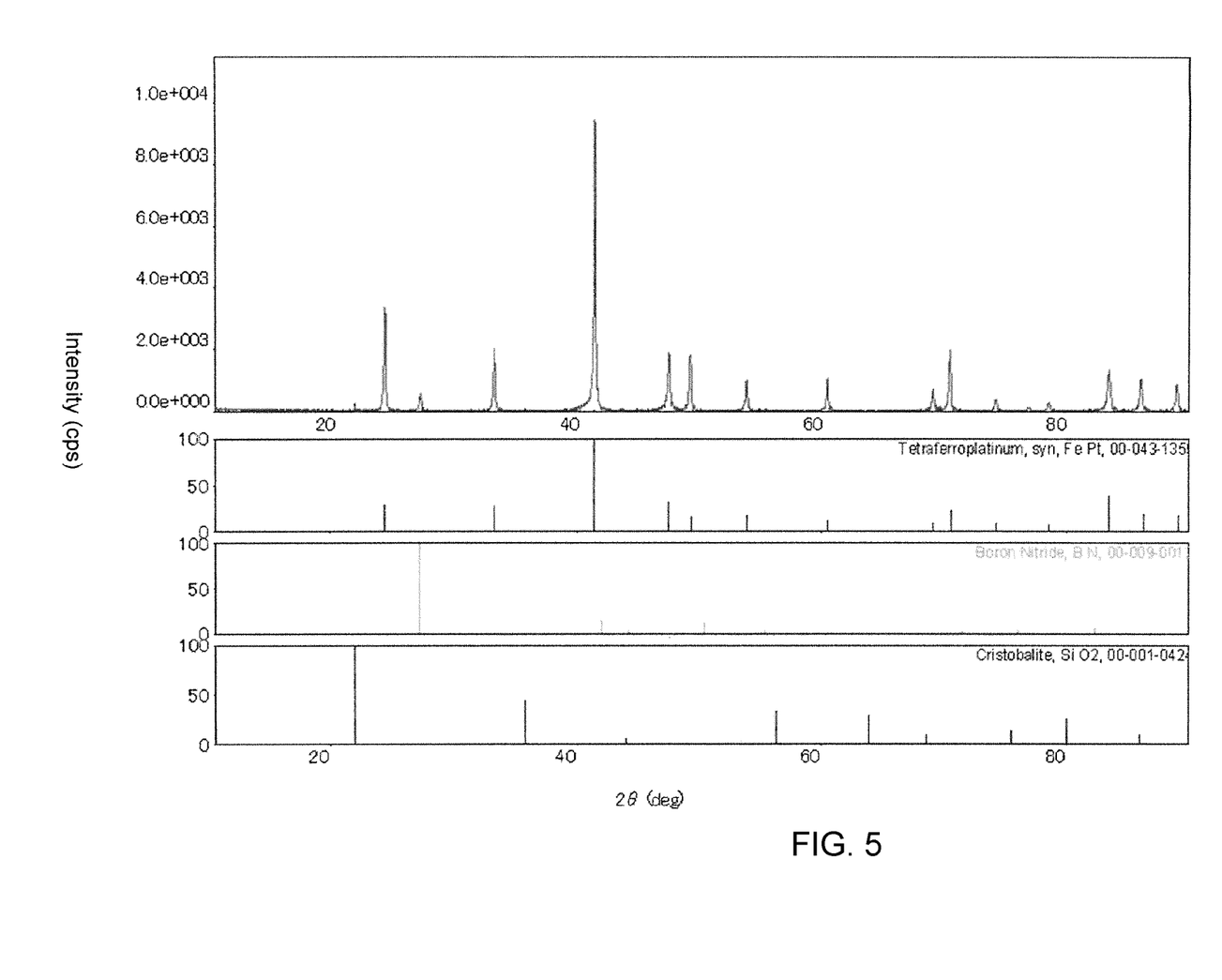
FIG. 5 shows an X-ray diffraction profile of the sintered compact from Example 2 (top panel).
Figure 6:
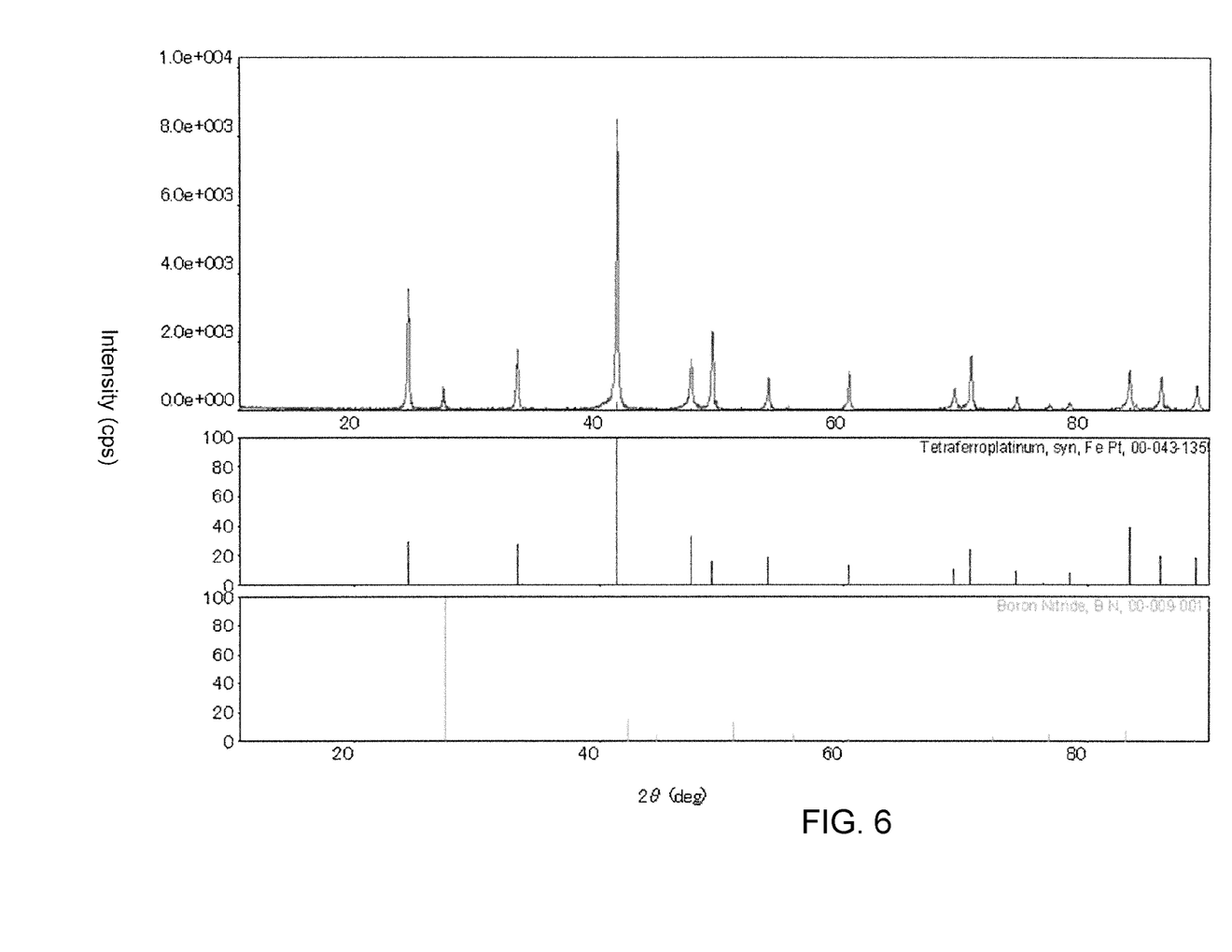
FIG. 6 shows an X-ray diffraction profile of a sintered compact from Comparative Example 2 (top panel).

An edge of the obtained sintered compact was cut out, and a cut surface was polished to analyze its structure with an FE-EPMA. FIG. 1 shows measurement results from element mapping of the cut surface of the sintered compact obtained in this way. As shown in FIG. 1, the presence of Si and O was observed at a location where B or N was present, demonstrating that solid dissolution of BN and $SiO_2$ was progressed.

Further, as a result of analyzing a cut surface of the sintered compact by the X-ray diffraction method (XRD), an X-ray diffraction peak intensity ratio of the (002) plane of BN was 5.46, and an X-ray diffraction peak intensity ratio of the (101) plane of $SiO_2$ cristobalite was 1.38.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering. The sputtering conditions were as follows: an input power of 1 kW and an Ar gas pressure of 1.7 MPa, and pre-sputtering was performed at 2 kWhr. Then deposition was performed on a Si substrate having a diameter of 4 inches for 20 seconds. Subsequently, the number of particles adhering on the substrate was measured with a particle counter. At this time, the number of particles was 20.

Comparative Example 1

As an example in which BN alone was contained, a Fe powder, a Pt powder, an Ag powder, and a BN powder were prepared as raw material powders in Comparative Example 1. These powders were weighed out to give 60(50Fe-45Pt-5Ag)-40BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, a rate of temperature increase of 300° C./hour, a holding temperature of 950° C. and a holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 96.1%, showing a decrease as compared with Example 1. Note that as a result of analyzing a cut surface of the sintered compact by the X-ray diffraction method (XRD), an X-ray diffraction peak intensity ratio of the (002) plane of BN was 5.42.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 840, showing a significant increase as compared with Example 1.

Example 2

As raw material powders, a Fe powder, a Pt powder, a $SiO_2$ powder and a BN powder were prepared. These powders were weighed out to give 70(50Fe-50Pt)-5$SiO_2$-25BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, a rate of temperature increase of 300° C./hour, a holding temperature of 950° C. and a holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 98.3%.

An edge of the obtained sintered compact was cut out, and a cut surface was polished as in Example 1 to analyze its structure with an FE-EPMA. As a result, the presence of Si and O was observed at a location where B or N was present, demonstrating that solid dissolution of BN and $SiO_2$ was progressed. Further, as a result of analyzing a cut surface of the sintered compact by the X-ray diffraction method (XRD), an X-ray diffraction peak intensity ratio of the (002) plane of BN was 17.98, and an X-ray diffraction peak intensity ratio of the (101) plane of $SiO_2$ cristobalite was 1.27.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 31.

Comparative Example 2

As an example in which BN alone was contained, a Fe powder, a Pt powder, an Ag powder, and a BN powder were prepared as raw material powders in Comparative Example 2. These powders were weighed out to give 70(50Fe-50Pt)-30BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, a rate of temperature increase of 300° C./hour, a holding temperature of 950° C. and a holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 96.7%, showing a decrease as compared with Example 2. Note that as a result of analyzing a cut surface of the sintered compact by the X-ray diffraction method (XRD), an X-ray diffraction peak intensity ratio of the (002) plane of BN was 21.4.

Next, the sintered compact was cut with a lathe into a shape having a diameter of 180.0 mm and a thickness of 5.0 mm, and then mounted on a magnetron sputtering equipment (Canon Melva Corporation, a C-3010 sputtering system) to perform sputtering as in Example 1. Subsequently, the number of particles adhering on the substrate was measured with a particle counter. At this time, the number of particles was 795, showing a significant increase as compared with Example 2.

Example 3

As raw material powders, a Fe powder, a Pt powder, a Cu powder, a $SiO_2$ powder, a BN powder, a $TiO_2$ powder and an MgO powder were prepared. These powders were weighed out to give 73(30Fe-60Pt-10Cu)-5$SiO_2$-20BN-1$TiO_2$-1MgO (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1060° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 1100° C. and a holding time of 2 hours, and the Ar gas pressure was gradually increased from the start of temperature increase, and maintained at 150 MPa during holding at 1100° C. After the end of holding, it was kept in the furnace to allow natural cooling.

The density of the sintered compact manufactured in this way was measured by the Archimedes method to calculate a relative density. The result was 98.6%.

An edge of the obtained sintered compact was cut out, and a cut surface was polished as in Example 1 to analyze its structure with an FE-EPMA. As a result, the presence of Si and O was observed at a location where B or N was present, demonstrating that solid dissolution of BN and $SiO_2$ was progressed. Further, as a result of analyzing a cut surface of the sintered compact by the X-ray diffraction method (XRD), an X-ray diffraction peak intensity ratio of the (002) plane of BN was 7.24, and an X-ray diffraction peak intensity ratio of the (101) plane of $SiO_2$ cristobalite was 1.32.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 16.

Comparative Example 3

As an example in which BN alone was contained, a Fe powder, a Pt powder, a Cu powder, a BN powder, a $TiO_2$ powder and an MgO powder were prepared as raw material powders in Comparative Example 3. These powders were weighed out to give 78(3Fe-60Pt-10Cu)-20BN-1$TiO_2$-1MgO (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1060° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase at 300° C./hour, a holding temperature of 1100° C. and a holding time of 2 hours, and the Ar gas pressure was gradually increased from the start of temperature increase, and maintained at 150 MPa during holding at 1100° C. After the end of holding, it was kept in the furnace to allow natural cooling.

The density of the sintered compact manufactured in this way was measured by the Archimedes method to calculate a relative density. The result was 96.3%, showing a decrease as compared with Example 3. Note that as a result of analyzing a cut surface of the sintered compact by the X-ray diffraction method (XRD), an X-ray diffraction peak intensity ratio of the (002) plane of BN was 7.38.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 645, showing a significant increase as compared with Example 3.

Example 4

As raw material powders, a Fe powder, a Pt powder, a B powder, a Ru powder, a $SiO_2$ powder and a BN powder were prepared. These powders were weighed out to give 75(70Fe-20Pt-5B-5Ru)-5$SiO_2$-20BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1100° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase at 300° C./hour, a holding temperature of 1100° C. and a holding time of 2 hours, and the Ar gas pressure was gradually increased from the start of temperature increase, and maintained at 150 MPa during holding at 1100° C. After the end of holding, it was kept in the furnace to allow natural cooling.

The density of the sintered compact manufactured in this way was measured by the Archimedes method to calculate a relative density. The result was 97.9%.

An edge of the obtained sintered compact was cut out, and a cut surface was polished as in Example 1 to analyze its structure with an FE-EPMA. As a result, the presence of Si and O was observed at a location where B or N was present, demonstrating that solid dissolution of BN and $SiO_2$ was progressed. Further, as a result of analyzing a cut surface of the sintered compact by the X-ray diffraction method (XRD), an X-ray diffraction peak intensity ratio of the (002) plane of BN was 10.82, and an X-ray diffraction peak intensity ratio of the (101) plane of $SiO_2$ cristobalite was 1.18.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 33.

Comparative Example 4

As an example in which BN alone was contained, a Fe powder, a Pt powder, a B powder, a Ru powder, and a BN powder were prepared as raw material powders in Comparative Example 4. These powders were weighed out to give 80(70Fe-20Pt-5B-5Ru)-20BN (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1200° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 1100° C. and a holding time of 2 hours, and the Ar gas pressure was gradually increased from the start of temperature increase, and maintained at 150 MPa during holding at 1100° C. After the end of holding, it was kept in the furnace to allow natural cooling.

The density of the sintered compact manufactured in this way was measured by the Archimedes method to calculate a relative density. The result was 96.2%, showing a decrease as compared with Example 4. Note that as a result of analyzing a cut surface of the sintered compact by the X-ray diffraction method (XRD), an X-ray diffraction peak intensity ratio of the (002) plane of BN was 10.59.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 816, showing a significant increase as compared with Example 4.

Example 5

As raw material powders, a Fe powder, a Pt powder, an Au powder, a $SiO_2$ powder, a BN powder and a SiC powder were prepared. These powders were weighed out to give 74(48Fe-48Pt-4Au)-5$SiO_2$-20BN-1SiC (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1050° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 97.6%.

An edge of the obtained sintered compact was cut out, and a cut surface was polished as in Example 1 to analyze its structure with an FE-EPMA. As a result, the presence of Si and O was observed at a location where B or N was present, demonstrating that solid dissolution of BN and $SiO_2$ was progressed. Further, as a result of analyzing a cut surface of the sintered compact by the X-ray diffraction method (XRD), an X-ray diffraction peak intensity ratio of the (002) plane of BN was 5.96, and an X-ray diffraction peak intensity ratio of the (101) plane of $SiO_2$ cristobalite was 1.24.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 36.

Comparative Example 5

As an example in which BN alone was contained, a Fe powder, a Pt powder, an Au powder, a BN powder and a SiC powder were prepared as raw material powders in Comparative Example 5. These powders were weighed out to give 79(48Fe-48Fe-4Au)-20BN-1SiC (mol %).

Next, the weighed powders were introduced into a 5-liter medium agitation mill along with zirconia balls as grinding media, and rotated (a rotation speed of 300 rpm) for 2 hours to perform mixing and grinding. Then a carbon mold was filled with a mixed powder removed from the medium agitation mill, and hot press was performed.

The conditions of hot press were similar to those in Example 1: vacuum atmosphere, the rate of temperature increase of 300° C./hour, holding temperature of 1050° C. and holding time of 2 hours, and pressure was applied at 30 MPa from the beginning of temperature increase through the end of holding. After the end of holding, it was kept in the chamber to allow natural cooling.

Next, a sintered compact removed from the hot press mold was subjected to hot isostatic pressing process. The conditions for hot isostatic pressing process were similar to those in Example 1: a rate of temperature increase of 300° C./hour, a holding temperature of 950° C. and a holding time of 2 hours, and the Ar gas pressure was gradually increased from the start of temperature increase, and maintained at 150 MPa during holding at 950° C. After the end of holding, it was kept in the furnace to allow natural cooling.

The density of the sintered compact manufactured in this way was measured by the Archimedes method to calculate a relative density. The result was 95.3%, showing a decrease as compared with Example 5. Note that as a result of analyzing a cut surface of the sintered compact by the X-ray diffraction method (XRD), an X-ray diffraction peak intensity ratio of the (002) plane of BN was 5.86.

Next, the sintered compact was cut with a lathe into a shape having a diameter of 180.0 mm and a thickness of 5.0 mm, and then mounted on a magnetron sputtering equipment (Canon Anelva Corporation, a C-3010 sputtering system) to perform sputtering as in Example 1. Subsequently, the number of particles adhering on the substrate was measured with a particle counter. At this time, the number of particles was 942, showing a significant increase as compared with Example 5.

As demonstrated by the above results, the sputtering targets according to the present invention, in which the high density of the sputtering target was maintained by inclusion of $SiO_2$ along with hexagonal BN as non-magnetic materials, showed a superior effect in that the number of particles generated during sputtering can be significantly suppressed.

mol % or less of one or more elements selected from the group consisting of B, Ru, Ag, Au and Cu forming a sintered alloy and particles of hexagonal BN and $SiO_2$ dispersed in the sintered alloy, wherein, in an element mapping image obtained by a Field Emission Electron Probe Micro Analyzer (FE-EPMA) of a cross-sectional surface of the sintered compact, elements of Si and O are detected in a same area as that where elements of B and N are detected, and wherein, in X-ray diffraction analysis of a cross-sectional surface of the sintered compact which is parallel to a pressurized face of the sintered compact, an X-ray diffraction peak from (002) plane of hexagonal BN is present, and an X-ray diffraction peak from (101) plane of cristobalite has an intensity ratio of 1.40 or less relative to a back-ground intensity of the (101) X-ray diffraction peak.

2. The Fe—Pt based magnetic material sintered compact according to claim 1, wherein the X-ray diffraction peak from (002) plane of hexagonal BN has an intensity ratio of 1.50 or more relative to a back-ground intensity of the (002) X-ray diffraction peak.

3. The Fe—Pt based magnetic material sintered compact according to claim 2, wherein the content of $SiO_2$ has a ratio of 1% or more relative to the content of hexagonal BN.

4. The Fe—Pt based magnetic material sintered compact according to claim 3, wherein the sintered compact has a content of Pt in an amount of 5 mol % or more and 60 mol % or less, a content of BN in an amount of 1 mol % or more and 50 mol % or less, and a content of $SiO_2$ in an amount of 0.5 mol % or more and 20 mol % or less.

5. The Fe—Pt based magnetic material sintered compact according to claim 1, wherein a content of $SiO_2$ in the sintered compact has a ratio of 1% or more relative to a content of hexagonal BN.

6. The Fe—Pt based magnetic material sintered compact according to claim 1, wherein the sintered compact has a content of Pt in an amount of 5 mol % or more and 60 mol

TABLE 1

| | Composition Ratio (mol %) | X-ray diffraction peak intensity ratio of BN (002) plane | X-ray diffraction peak intensity ratio of SiO2 cristobalite (101) plane | Relative density (%) | Number of particles |
|---|---|---|---|---|---|
| Example 1 | 65(50Fe—45Pt—5Ag)—5SiO₂—30BN | 5.46 | 1.38 | 97.9 | 20 |
| Comparative Example 1 | 60(50Fe—45Pt—5Ag)—40BN | 5.42 | — | 96.1 | 840 |
| Example 2 | 70(50Fe—50Pt)—5SiO₂—25BN | 17.98 | 1.27 | 98.3 | 31 |
| Comparative Example 2 | 70(50Fe—50Pt)—30BN | 21.4 | — | 96.7 | 795 |
| Example 3 | 73(30Fe—60Pt—10Cu)—5SiO₂—20BN—1TiO2—1MgO | 7.24 | 1.32 | 98.6 | 16 |
| Comparative Example 3 | 78(30Fe—60Pt—10Cu)—20BN—1TiO2—1MgO | 7.38 | — | 96.3 | 645 |
| Example 4 | 75(70Fe—20Pt—5B—5Ru)—5SiO₂—20BN | 10.82 | 1.18 | 97.9 | 33 |
| Comparative Example 4 | 80(70Fe—20Pt—5B—5Ru)—20BN | 10.59 | — | 96.2 | 816 |
| Example 5 | 74(48Fe—48Pt—4Au)—5SiO₂—20BN—1SiC | 5.96 | 1.24 | 97.6 | 36 |
| Comparative Example 5 | 79(48Fe—48Pt—4Au)—20BN—1SiC | 5.86 | — | 95.3 | 942 |

Advantageously, the Fe—Pt based sintered compact according to the present invention, in which BN is used as a non-magnetic material, can provide a high density sputtering target in which the amount of particles generated during sputtering is reduced. Therefore, it is useful as a sputtering target used for deposition of a magnetic thin film having a granular structure.

I claim:

1. A Fe—Pt based magnetic material sintered compact, consisting of iron, platinum and 0.5 mol % or more and 10.0

% or less, a content of BN in an amount of 1 mol % or more and 50 mol % or less, a content of $SiO_2$ in an amount of 0.5 mol % or more and 20 mol % or less.

7. A Fe—Pt based magnetic material sintered compact, consisting of iron and platinum forming a sintered Fe—Pt alloy, particles of hexagonal BN and $SiO_2$ dispersed in the sintered Fe—Pt alloy, and at least one inorganic material selected from the group consisting of oxides other than $SiO_2$, nitrides other than BN, carbides and carbon nitrides as an additive, wherein, in an element mapping image obtained by a Field Emission Electron Probe Micro Analyzer (FE-EPMA) of a cross-sectional surface of the sintered compact, elements of Si and O are detected in a same area as that where elements of B and N are detected, and wherein, in X-ray diffraction analysis of a cross-sectional surface of the sintered compact which is parallel to a pressurized face of the sintered compact, an X-ray diffraction peak from (002) plane of hexagonal BN is present, and an X-ray diffraction peak from (101) plane of cristobalite has an intensity ratio of 1.40 or less relative to a back-ground intensity of the (101) X-ray diffraction peak.

8. The Fe—Pt based magnetic material sintered compact according to claim 7, wherein the X-ray diffraction peak from (002) plane of hexagonal BN has an intensity ratio of 1.50 or more relative to a back-ground intensity of the (002) X-ray diffraction peak.

9. The Fe—Pt based magnetic material sintered compact according to claim 8, wherein the content of $SiO_2$ has a ratio of 1% or more relative to the content of hexagonal BN.

10. The Fe—Pt based magnetic material sintered compact according to claim 9, wherein the sintered compact has a content of Pt in an amount of 5 mol % or more and 60 mol % or less, a content of BN in an amount of 1 mol % or more and 50 mol % or less, and a content of $SiO_2$ in an amount of 0.5 mol % or more and 20 mol % or less.

11. The Fe—Pt based magnetic material sintered compact according to claim 7, wherein a content of $SiO_2$ in the sintered compact has a ratio of 1% or more relative to a content of hexagonal BN.

12. The Fe—Pt based magnetic material sintered compact according to claim 7, wherein the sintered compact has a content of Pt in an amount of 5 mol % or more and 60 mol % or less, a content of BN in an amount of 1 mol % or more and 50 mol % or less, a content of $SiO_2$ in an amount of 0.5 mol % or more and 20 mol % or less.

13. A Fe—Pt based magnetic material sintered compact, consisting of iron, platinum and 0.5 mol % or more and 10.0 mol % or less of one or more elements selected from the group consisting of B, Ru, Ag, Au and Cu forming a sintered alloy and particles of hexagonal BN and $SiO_2$ dispersed in the sintered alloy and at least one inorganic material selected from the group consisting of oxides other than $SiO_2$, nitrides other than BN, carbides and carbon nitrides as an additive, wherein, in an element mapping image obtained by a Field Emission Electron Probe Micro Analyzer (FE-EPMA) of a cross-sectional surface of the sintered compact, elements of Si and O are detected in a same area as that where elements of B and N are detected, and wherein, in X-ray diffraction analysis of a cross-sectional surface of the sintered compact which is parallel to a pressurized face of the sintered compact, an X-ray diffraction peak from (002) plane of hexagonal BN is present, and an X-ray diffraction peak from (101) plane of cristobalite has an intensity ratio of 1.40 or less relative to a back-ground intensity of the (101) X-ray diffraction peak.

14. The Fe—Pt based magnetic material sintered compact according to claim 13, wherein the X-ray diffraction peak from (002) plane of hexagonal BN has an intensity ratio of 1.50 or more relative to a back-ground intensity of the (002) X-ray diffraction peak.

15. The Fe—Pt based magnetic material sintered compact according to claim 14, wherein the content of $SiO_2$ has a ratio of 1% or more relative to the content of hexagonal BN.

16. The Fe—Pt based magnetic material sintered compact according to claim 15, wherein the sintered compact has a content of Pt in an amount of 5 mol % or more and 60 mol % or less, a content of BN in an amount of 1 mol % or more and 50 mol % or less, and a content of $SiO_2$ in an amount of 0.5 mol % or more and 20 mol % or less.

17. The Fe—Pt based magnetic material sintered compact according to claim 13, wherein a content of $SiO_2$ in the sintered compact has a ratio of 1% or more relative to a content of hexagonal BN.

18. The Fe—Pt based magnetic material sintered compact according to claim 13, wherein the sintered compact has a content of Pt in an amount of 5 mol % or more and 60 mol % or less, a content of BN in an amount of 1 mol % or more and 50 mol % or less, a content of $SiO_2$ in an amount of 0.5 mol % or more and 20 mol % or less.

\* \* \* \* \*